United States Patent
Chen et al.

(10) Patent No.: US 12,113,495 B2
(45) Date of Patent: Oct. 8, 2024

(54) AMPLIFIER CIRCUIT HAVING ADJUSTABLE GAIN

(71) Applicant: RICHWAVE TECHNOLOGY CORP., Taipei (TW)

(72) Inventors: Chih-Sheng Chen, Taipei (TW); Ching-Wen Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 403 days.

(21) Appl. No.: 17/499,831

(22) Filed: Oct. 12, 2021

(65) Prior Publication Data

US 2023/0031137 A1 Feb. 2, 2023

(30) Foreign Application Priority Data

Jul. 29, 2021 (TW) ................. 110127807

(51) Int. Cl.
*H03F 1/12* (2006.01)
*H03F 3/45* (2006.01)
*H03F 3/50* (2006.01)

(52) U.S. Cl.
CPC ......... *H03F 3/505* (2013.01); *H03F 3/45179* (2013.01); *H03F 1/12* (2013.01); *H03F 2200/387* (2013.01)

(58) Field of Classification Search
CPC ............. H03F 3/505; H03F 3/45179; H03F 2200/387; H03F 1/3205; H03F 1/56; H03F 2200/417; H03F 1/223; H03G 2201/106; H03G 2201/502
USPC .................................. 330/207, 284
See application file for complete search history.

(56) References Cited

U.S. PATENT DOCUMENTS

| | | | | |
|---|---|---|---|---|
| 7,948,317 | B2 * | 5/2011 | Wan | H03G 3/3042 330/277 |
| 2003/0058041 | A1 * | 3/2003 | Koizumi | H03F 3/189 330/51 |
| 2018/0138868 | A1 | 5/2018 | Darwish | |

FOREIGN PATENT DOCUMENTS

| | | |
|---|---|---|
| CN | 102158187 A | 8/2011 |
| CN | 107612516 A | 1/2018 |
| JP | 4936151 | 5/2012 |
| TW | 449962 | 8/2001 |

* cited by examiner

*Primary Examiner* — Andrea Lindgren Baltzell
*Assistant Examiner* — Khiem D Nguyen
(74) *Attorney, Agent, or Firm* — Winston Hsu

(57) ABSTRACT

An amplifier circuit having an adjustable gain is provided. The amplifier circuit includes an input terminal, an output terminal, an amplifier, and an attenuation circuit. The input terminal receives an input signal, which is in turn received by an input terminal of the amplifier. An output terminal of the amplifier outputs the input signal that is amplified. The attenuation circuit is coupled between the output terminal of the amplifier and the output terminal to provide a plurality of attenuation to the input signal that is amplified and generate a first attenuation signal, or between the input terminal and the output terminal to provide the plurality of attenuations to the input signal and generate a second attenuation signal. A difference between an impedance value of the input terminal of the attenuation circuit and an impedance value of the output terminal of the attenuation circuit is within a predetermined range.

18 Claims, 10 Drawing Sheets

AMPLIFIER CIRCUIT HAVING ADJUSTABLE GAIN

CROSS-REFERENCE TO RELATED PATENT APPLICATION

This application claims the benefit of priority to Taiwan Patent Application No. 110127807, filed on Jul. 29, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an amplifier circuit, and more particularly to an amplifier circuit having an adjustable gain.

BACKGROUND OF THE DISCLOSURE

With the rise in popularity of the Internet and mobile devices, a demand for communication quality is getting higher. However, conventional single-stage amplifiers have a limited range of gain values, and cannot meet current design or practical requirements. Therefore, providing an amplifier circuit having an adjustable gain is an important issue in the related field.

SUMMARY OF THE DISCLOSURE

In response to the above-referenced technical inadequacy, the present disclosure provides an amplifier circuit having an adjustable gain.

In one aspect, the present disclosure provides an amplifier circuit having an adjustable gain. The amplifier circuit includes an input terminal, an output terminal, an amplifier, and an attenuation circuit. The input terminal is used for receiving an input signal. The output terminal is used for outputting an output signal. The amplifier includes an input terminal and an output terminal. The input terminal of the amplifier receives the input signal through the input terminal of the amplifier circuit. The output terminal of the amplifier is used for outputting the input signal that is amplified. The attenuation circuit includes an input terminal and an output terminal. The input terminal of the attenuation circuit is coupled to the output terminal of the amplifier, and the output terminal of the attenuation circuit is coupled to the output terminal of the amplifier circuit, so as to provide a plurality of attenuation to the input signal that is amplified and generate a first attenuation signal. Alternatively, the input terminal of the attenuation circuit is coupled to the input terminal of the amplifier circuit, and the output terminal of the attenuation circuit is coupled to the output terminal of the amplifier circuit, so as to provide the plurality of attenuations to the input signal and generate a second attenuation signal. A difference between an impedance value of the input terminal of the attenuation circuit and an impedance value of the output terminal of the attenuation circuit is within a predetermined range.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
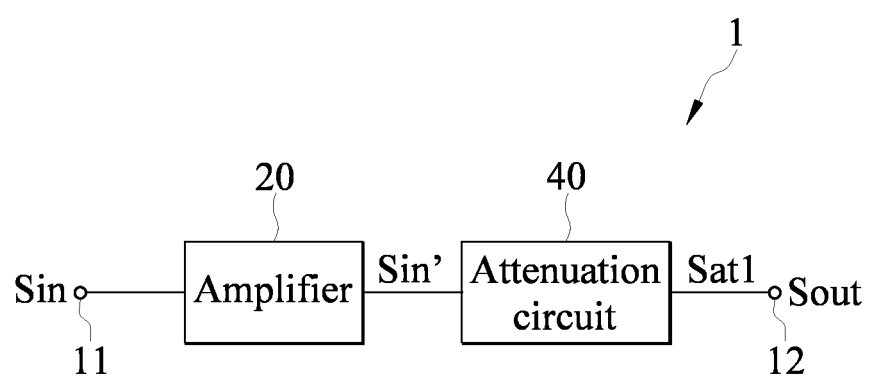
FIG. 1 is a schematic block diagram of an amplifier circuit having an adjustable gain according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, FIG. 1 is a schematic block diagram of an amplifier circuit having an adjustable gain according to a first embodiment of the present disclosure. An amplifier circuit 1 having an adjustable gain of the first embodiment of the present disclosure includes an input terminal 11 and an output terminal 12. Moreover, the amplifier circuit 1 can include an amplifier 20 and an attenuation circuit 40.

The input terminal 11 can be used for receiving an input signal Sin, and the output terminal 12 can be used for outputting an output signal Sout. The output signal Sout can be used in a back-end circuit. Each of the input signal Sin and the output signal Sout is, for example but not limited to, a radio frequency signal.

An input terminal of the amplifier 20 can receive the input signal Sin through the input terminal 11, and can amplify the input signal Sin according to a gain of the amplifier 20, so as to output the input signal that is amplified Sin' through an output terminal of the amplifier 20. The amplifier 20 can include a low-noise amplifier or a power amplifier.

An input terminal of the attenuation circuit 40 can be coupled to the output terminal of the amplifier 20, and an output terminal of the attenuation circuit 40 can be coupled to the output terminal 12. The attenuation circuit 40 can be configured to provide a plurality of attenuation to the input signal that is amplified Sin', and accordingly generate an attenuation signal Sat1. For example, the attenuation circuit 40 can select one of the plurality of attenuations according to a gain value required for the amplifier circuit 1, so as to attenuate an amplitude of the input signal that is amplified Sin' to a certain value, thereby generating the attenuation signal Sat1. The output signal Sout can be generated from the attenuation signal Sat1. In this way, the gain value of the amplifier circuit 1 can be related to a degree of the attenuation of the input signal that is amplified Sin'. That is to say, the gain value required for the amplifier circuit 1 can be achieved based on the degree of attenuation of the input signal that is amplified Sin'. The gain value of the amplifier circuit 1 can be 0 dB or more. It should be noted that, since the attenuation circuit 40 can be used for providing the plurality of attenuations to the input signal that is amplified Sin', the gain value of the amplifier circuit 1 is no longer limited to a gain value range of the amplifier 20, but a gain value range of the amplifier circuit 1 can be expanded and the gain value of the amplifier circuit 1 can be adjusted through the attenuation circuit 40. In addition, since the attenuation circuit 40 is arranged behind the output terminal of the amplifier 20, the attenuation circuit 40 is less likely to generate a loading effect at the input terminal of the amplifier 20, such that a performance of the amplifier circuit 1 is less likely to be affected, and a linearity and a noise figure of the amplifier circuit 1 can be maintained.

Second Embodiment

Figure 2:
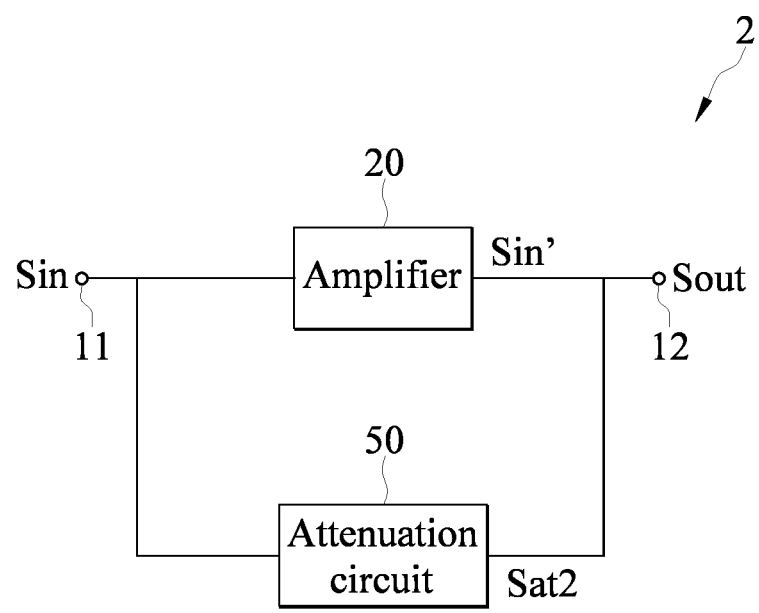
FIG. 2 is a schematic block diagram of an amplifier circuit having an adjustable gain according to a second embodiment of the present disclosure.

Referring to FIG. 2, FIG. 2 is a schematic block diagram of an amplifier circuit having an adjustable gain according to a second embodiment of the present disclosure. The difference between the second embodiment and the first embodiment is that, an amplifier circuit 2 having an adjustable gain of the second embodiment of the present disclosure can include the amplifier 20 and an attenuation circuit 50.

An input terminal of the attenuation circuit 50 can be coupled to the input terminal 11, and an output terminal of the attenuation circuit 50 can be coupled to the output terminal 12. The attenuation circuit 50 can be configured to provide a plurality of attenuation to the input signal Sin, and accordingly generate an attenuation signal Sat2. For example, the attenuation circuit 50 can select one of the plurality of attenuations according to a gain value required for the amplifier circuit 2, so as to attenuate an amplitude of the input signal Sin to a certain value, thereby generating the attenuation signal Sat2.

Furthermore, the amplifier circuit 2 can operate in an amplification mode or a bypass mode. When an intensity of the input signal Sin is not strong enough and needs to be amplified by the amplifier 20, the amplifier 20 is enabled and the amplifier circuit 2 can operate in the amplification mode so as to have a first gain value. Moreover, the input signal Sin is input from the input terminal 11 to the amplifier 20, and the amplifier 20 amplifies the input signal Sin according to a gain of the amplifier 20, so as to output the input signal that is amplified Sin' from the output terminal of the amplifier 20. The output signal Sout can be generated from the input signal that is amplified Sin'. Accordingly, the first gain value is related to the gain of the amplifier 20. When the intensity of the input signal Sin is strong enough that the amplification through the amplifier 20 is no longer required, the amplifier 20 is disabled and the amplifier circuit 2 can operate in the bypass mode so as to have a second gain value. It should be noted that unnecessary current consumption can be decreased in the amplifier 20 that is disabled. Further, the input signal Sin is input from the input terminal 11 to the attenuation circuit 50, and the attenuation circuit 50 attenuates the input signal Sin according to the one of the plurality of attenuations that is selected so as to generate the attenuation signal Sat2. The output signal Sout can be generated from the attenuation signal Sat2. In this way, the second gain value is related to a degree of the attenuation of the input signal Sin. That is to say, the second gain value required for the amplifier circuit 2 can be achieved based on the degree of attenuation of the input signal Sin. The second gain value can be less than the first gain value. The first gain value can be greater than 0 dB, and the second gain value can be 0 dB or less. It should be noted that, since the attenuation circuit 50 can be used for providing the plurality of attenuations to the input signal Sin, a gain value range of the amplifier circuit 2 can be expanded and the gain value of the amplifier circuit 2 can be adjusted through the attenuation circuit 50.

Third Embodiment

Figure 3:
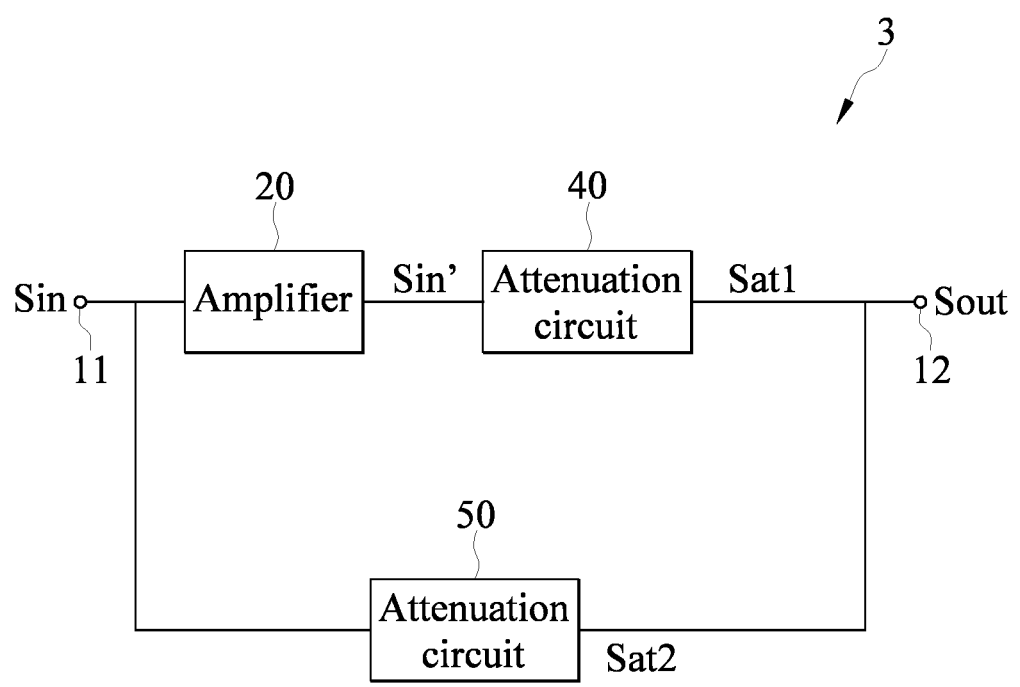
FIG. 3 is a schematic block diagram of an amplifier circuit having an adjustable gain according to a third embodiment of the present disclosure.

Referring to FIG. 3, FIG. 3 is a schematic block diagram of an amplifier circuit having an adjustable gain according to a third embodiment of the present disclosure. The difference between the third embodiment and the second embodiment is that, an amplifier circuit 3 having an adjustable gain of the third embodiment of the present disclosure can further include the attenuation circuit 40. The input terminal of the attenuation circuit 40 can be coupled to the output terminal of the amplifier 20, and the output terminal of the attenuation circuit 40 can be coupled to the output terminal 12. The attenuation circuit 40 and the attenuation circuit 50 can provide the plurality of attenuations to the input signal that is amplified Sin' and the input signal Sin, respectively, and accordingly generate the attenuation signal Sat1 and the attenuation signal Sat2, respectively.

Compared to the second embodiment, when the amplifier circuit 3 operates in the amplification mode, the attenuation circuit 40 attenuates the input signal that is amplified Sin' according to the one of the plurality of attenuations that is selected, so as to generate the attenuation signal Sat1. The output single Sout can be generated from the attenuation signal Sat1. In this way, the first gain value is related to the degree of attenuation of the input signal that is amplified Sin'. That is to say, in the present embodiment, the first gain value required for the amplifier circuit 3 can be achieved based on the degree of attenuation of the input signal that is amplified Sin', and the second gain value required for the amplifier circuit 3 can be achieved based on the degree of attenuation of the input signal Sin. Since the input signal that is amplified Sin' is generated after the input signal Sin passes through the amplifier 20, the first gain value can be greater than the second gain value. The first gain value can be 0 dB or more, and the second gain value can be 0 dB or less.

Figure 4:
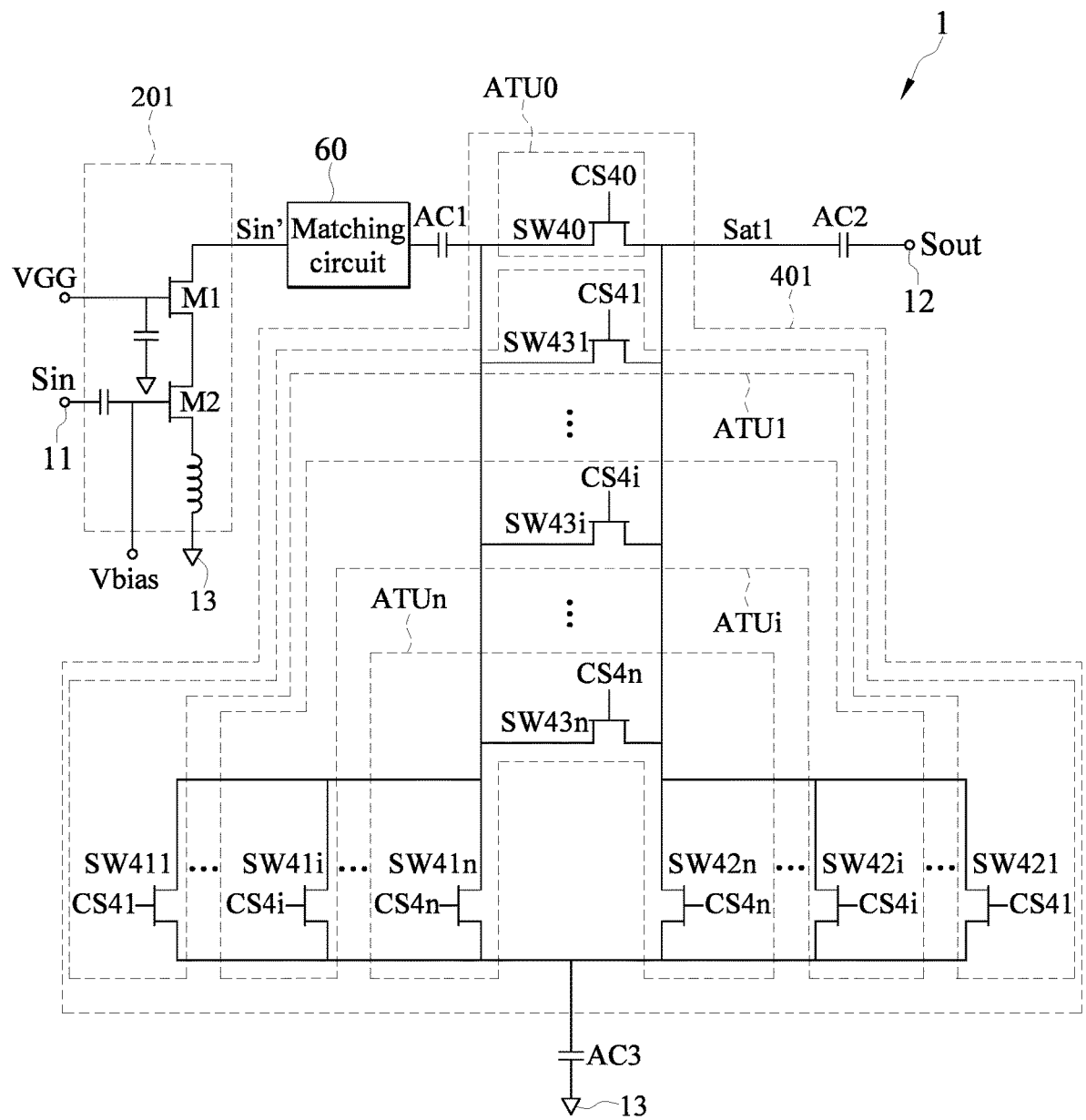
FIG. 4 is a schematic circuit layout diagram of the amplifier circuit having the adjustable gain according to the first embodiment of the present disclosure.

Referring to FIG. 4, FIG. 4 is a schematic circuit layout diagram of the amplifier circuit 1 having the adjustable gain according to the first embodiment of the present disclosure. An amplifier 201 and an attenuation circuit 401 of FIG. 4 can respectively correspond to the amplifier 20 and the attenuation circuit 40 of FIG. 1.

For example, as shown in FIG. 4, the amplifier 201 can include a transistor M1 and a transistor M2. A first terminal of the transistor M1 is coupled to an output terminal of the amplifier 201, and a control terminal of the transistor M1 can be used for receiving an operation signal VGG. The operation signal VGG can be used for enabling or disabling the amplifier 201. A first terminal of the transistor M2 is coupled to a second terminal of the transistor M1, a second terminal of the transistor M2 is coupled to a reference potential terminal 13, and a control terminal of the transistor M2 is coupled to an input terminal of the amplifier 201 and can be further used for receiving a bias signal Vbias. The bias signal Vbias can be used for biasing the transistor M2. The reference potential terminal 13 can be, but is not limited to, a ground potential terminal in a system. The attenuation circuit 401 can include a plurality of attenuation units ATU0 to ATUn. Each of the plurality of attenuation units ATU0 to ATUn is coupled between an input terminal and an output terminal of the attenuation circuit 401, and can be used for providing one of the plurality of attenuations. For example, the attenuation unit ATU0 can be used for providing an attenuation of 0 dB, the attenuation unit ATU1 can be used for providing an attenuation of 5 dB, the attenuation unit ATUi can be used for providing an attenuation of 10 dB, and the attenuation unit ATUn can be used for providing an attenuation of 20 dB. In other words, each of the plurality of attenuation units ATU0 to ATUn can be used for providing an attenuation of a different amount. It should be noted that, when one of the plurality of attenuation units (e.g., the attenuation unit ATU0) is enabled, the rest of the plurality of attenuation units (e.g., the attenuation units ATU1 to ATUn) are disabled.

The one of the plurality of attenuation units (e.g., the attenuation unit ATU0) can include a switch SW40, and a control terminal of the switch SW40 is used for receiving a control signal CS40. The control signal CS40 can be used for turning on or turning off the switch SW40, so as to enable or disable the attenuation unit ATU0 (e.g., turning on the switch SW40 can enable the attenuation unit ATU0, thereby providing the attenuation of 0 dB).

The rest of the plurality of attenuation units (e.g., the attenuation units ATU1 to ATUn) can each include a π-type attenuator. Further, the π-type attenuator of the attenuation unit ATU1 can include a switch SW411, a switch SW421, and a switch SW431, and a control terminal of each of the switch SW411, the switch SW421, and the switch SW431 is used for receiving a control signal CS41; the control signal CS41 can be used for correspondingly turning on or turning off the switch SW411, the switch SW421, and the switch SW431, so as to enable or disable the attenuation unit ATU1 (e.g., turning on the switch SW411, the switch SW421, and the switch SW431 can enable the attenuation unit ATU1, thereby providing the attenuation of 5 dB); the π-type attenuator of the attenuation unit ATUi can include a switch SW41$i$, a switch SW42$i$, and a switch SW43$i$, and a control terminal of each of the switch SW41$i$, the switch SW42$i$, and the switch SW43$i$ is used for receiving a control signal CS4$i$; the control signal CS4$i$ can be used for correspondingly turning on or turning off the switch SW41$i$, the switch SW42$i$, and the switch SW43$i$, so as to enable or disable the attenuation unit ATUi; the π-type attenuator of the attenuation unit ATUn can include a switch SW41$n$, a switch SW42$n$, and a switch SW43$n$, and a control terminal of each of the switch SW41$n$, the switch SW42$n$, and the switch SW43$n$ is used for receiving a control signal CS4$n$; the control signal CS4$n$ can be used for correspondingly turning on or turning off the switch SW41$n$, the switch SW42$n$, and the switch SW43$n$, so as to enable or disable the attenuation unit ATUn, and so on, where i and n are positive numbers. The control signals CS40 to CS4$n$ can be provided by an internal circuit of the attenuation circuit 401 (not shown in the figures) or an external circuit other than the attenuated circuit 401 (not shown in the figures). It should be noted that, although a quantity of the attenuation units shown in FIG. 4 is greater than two, in practice, the quantity of the attenuation units may vary depending on design or practical requirements. Therefore, the quantity of the attenuation units shown in FIG. 4 is for illustrative purposes only, and should not be construed as limiting the present disclosure.

In addition, a first terminal of the switch SW40 is coupled to the input terminal of the attenuation circuit 401, and a second terminal of the switch SW40 is coupled to the output terminal of the attenuation circuit 401. A first terminal of each of the switches SW411 to SW41$n$ is coupled to the input terminal of the attenuation circuit 401, and a second terminal of each of the switches SW411 to SW41$n$ is coupled to the reference potential terminal 13. A first terminal of each of the switches SW421 to SW42$n$ is coupled to the output terminal of the attenuation circuit 401, and a second terminal of each of the switches SW421 to SW42$n$ is coupled to the reference potential terminal 13. A first terminal of each of the switches SW431 to SW43$n$ is coupled to the input terminal of the attenuation circuit 401, and a second terminal of each of the switches SW431 to SW43$n$ is coupled to the output terminal of the attenuation circuit 401. In another embodiment, the attenuation circuit 40 shown in FIG. 3 can also include an architecture of the attenuation circuit 401 shown in FIG. 4.

The attenuation corresponding to each of the plurality of attenuation units ATU1 to ATUn can be related to a resistance value of each of the plurality of attenuation units ATU1 to ATUn. For example, a resistance value of an on-resistance of each of the switches SW411, SW421, and SW431, can be designed based on the attenuation corresponding to the attenuation unit ATU1; a resistance value of an on-resistance of each of the switches SW41$i$, SW42$i$, and SW43$i$, can be designed based on the attenuation corresponding to the attenuation unit ATUi; a resistance value of an on-resistance of each of the switches SW41$n$, SW42$n$, and SW43$n$, can be designed based on the attenuation corresponding to the attenuation unit ATUn, and so on. That is to say, the switches SW411 to SW43$n$ can not only be used for switching the corresponding attenuation unit ATU1 to ATUn, but also for providing the corresponding attenuation based on actual design. In another embodiment, the resistance values of the on-resistances of the switches SW411 and SW421 can be designed to be the same; the resistance values of the on-resistances of the switches SW41$i$ and SW42$i$ can be designed to be the same; the resistance values of the on-resistances of the switches SW41$n$ and SW42$n$ can be designed to be the same, and so on. In addition, taking the attenuation units ATU1, ATUi, and ATUn being respectively used for providing the attenuations of 5 dB, 10 dB, and 20 dB as an example, the resistance value of the on-resistance of the switch SW431 can be less than the resistance value of the on-resistance of the switch SW43$i$, and the resistance value of the on-resistance of the switch SW43$i$ can be less than the resistance value of the on-resistance of the switch SW43$n$. In the present embodiment, through a design of a channel width-to-length ratio of the switches SW411 to SW43$n$, the switches SW411 to SW43$n$ each can have the appropriate resistance value of the on-resistance. In this way, when one of the attenuation units ATU1 to ATUn is enabled, the corresponding attenuation can be provided.

It should be noted that, the attenuation circuit 401 includes the plurality of π-type attenuators and can be accordingly considered as having a roughly symmetrical circuit architecture. Under such the circuit architecture, a difference between an impedance value of the input terminal of the attenuation circuit 401 and an impedance value of the output terminal of the attenuation circuit 401 can be within a predetermined range regardless of which one of the attenuation units ATU0 to ATUn is enabled. The predetermined range can be ±10%. In another embodiment, the impedance value of the input terminal of the attenuation circuit 401 and the impedance value of the output terminal of the attenuation circuit 401 can be substantially equal, which can refer to a conjugate match that is achieved between the impedance value of the input terminal of the attenuation circuit 401 and the impedance value of the output terminal of the attenuation circuit 401. That is to say, the impedance value of the output terminal of the attenuation circuit 401 is a conjugate complex number of the impedance value of the input terminal of the attenuation circuit 401. Further, the impedance value of the input terminal of the attenuation circuit 401 can be an equivalent impedance value viewed inward from the input terminal of the attenuation circuit 401, and the impedance value of the output terminal of the attenuation circuit 401 can be an equivalent impedance value viewed outward from the output terminal of the attenuation circuit 401. In addition, a difference between an equivalent impedance value viewed inward from the output terminal of the amplifier 201 and an equivalent impedance value viewed outward from the output terminal 12 of the amplifier circuit 1 can also be within the predetermined range.

As shown in FIG. 4, the amplifier circuit 1 can further include a matching circuit 60, and capacitors AC1, AC2, and AC3. The matching circuit 60 is coupled between the output terminal of the amplifier 201 and the input terminal of the attenuation circuit 401, and can be used for providing an output impedance matched to the amplifier 201. The matching circuit 60 can include a resistor, an inductor, a capacitor, or any combination thereof. In the present embodiment, since in the attenuation circuit 401 the difference between the impedance value of the input terminal of the attenuation circuit 401 and the impedance value of the output terminal of the attenuation circuit 401 can be within the predetermined range, the arrangement of the attenuation circuit 401 does not easily affect a matching of the output impedance of the amplifier 201.

The capacitor AC1 is coupled between the matching circuit 60 and the attenuation circuit 401, the capacitor AC2 is coupled between the attenuation circuit 401 and the output terminal 12, and the capacitor AC3 is coupled between the attenuation circuit 401 and the reference potential terminal 13. The capacitor AC1 can be used for blocking a direct current bias from the amplifier 201, and the capacitors AC2 and AC3 can be used for blocking a direct current bias from the attenuation circuit 401.

Figure 5:
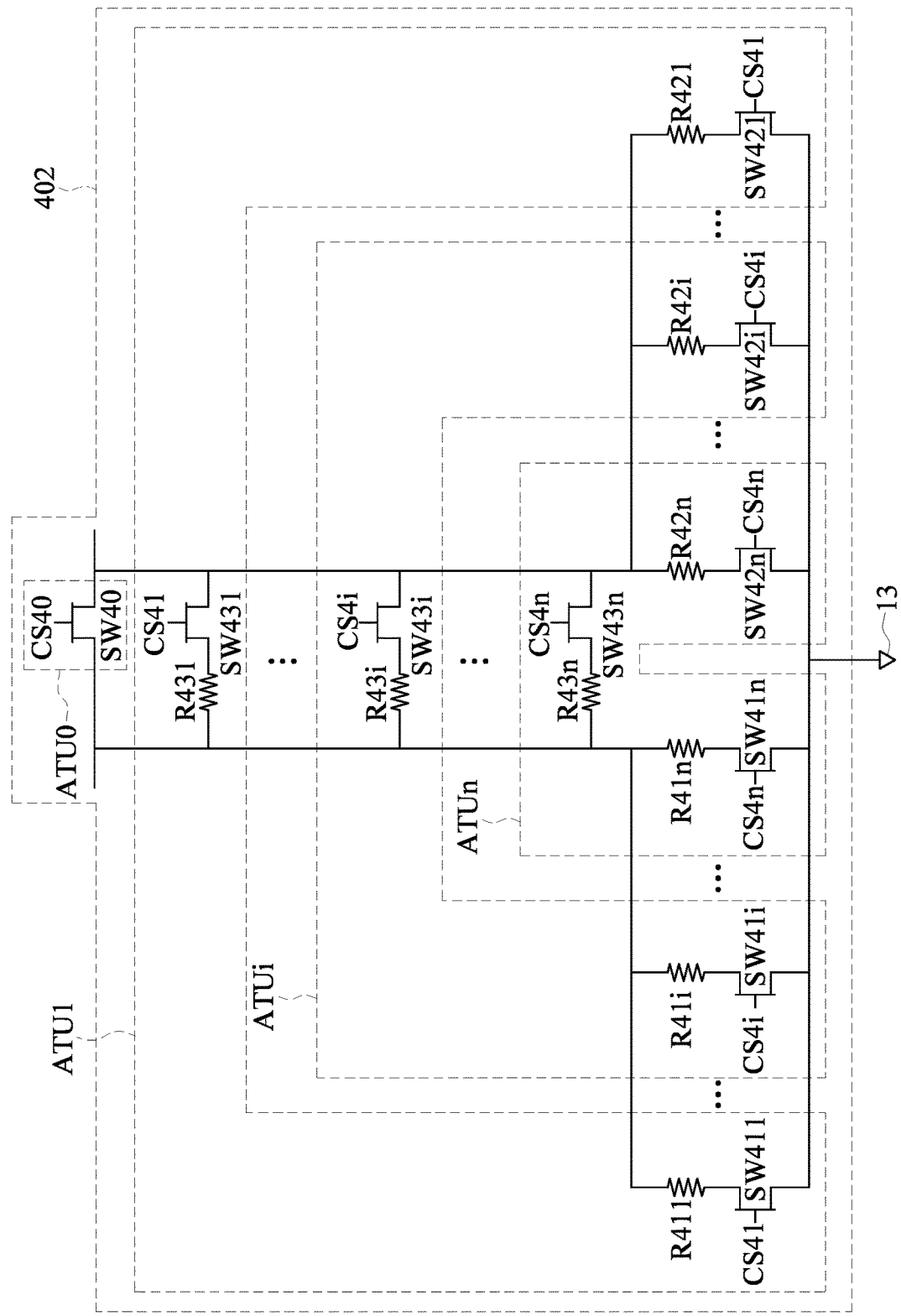
FIG. 5 is a schematic circuit layout diagram of an attenuation circuit of the amplifier circuit having the adjustable gain according to the first embodiment or the third embodiment of the present disclosure.

Referring to FIG. 5, FIG. 5 is another schematic circuit layout diagram of the attenuation circuit 40 of the amplifier circuit 1 or 3 having the adjustable gain according to the first embodiment or the third embodiment of the present disclosure. An attenuation circuit 402 of FIG. 5 can correspond to the attenuation circuit 40 of FIG. 1 or FIG. 3.

The main difference between the attenuation circuit 401 shown in FIG. 4 and the attenuation circuit 402 of FIG. 5 is that, the π-type attenuator of the attenuation unit ATU1 can further include resistors R411, R421, and R431; the π-type attenuator of the attenuation unit ATUi can further include resistors R41$i$, R42$i$, and R43$i$; the π-type attenuator of the attenuation unit ATUn can further include resistors R41$n$, R42$n$, and R43$n$, and so on.

As shown in FIG. 5, a first terminal of each of the resistors R411 to R41$n$ is coupled to the input terminal of the attenuation circuit 402, and a second terminal of each of the resistors R411 to R41$n$ is coupled to the first terminal of the switches SW411 to SW41$n$ that respectively correspond to the resistors R411 to R41$n$. A first terminal of each of the resistors R421 to R42$n$ is coupled to the output terminal of the attenuation circuit 402, and a second terminal of each of the resistors R421 to R42$n$ is coupled to the first terminal of the switches SW421 to SW42$n$ that respectively correspond to the resistors R421 to R42$n$. A first terminal of each of the resistors R431 to R43$n$ is coupled to the input terminal of the attenuation circuit 402, and a second terminal of each of the resistors R431 to R43$n$ is coupled to the first terminal of the switches SW431 to SW43$n$ that respectively correspond to the resistors R431 to R43$n$.

The resistor R411 to R43$n$ can be used for increasing a flexibility of the design corresponding to the resistance value of the attenuation units ATUi to ATUn. Further, the resistance values of the on-resistances of the switches SW411, SW421, and SW431 and/or resistance values of the resistors R411, R421, and R431 can be designed based on the attenuation corresponding to the attenuation unit ATU1; the resistance values of the on-resistances of the switches SW41$i$, SW42$i$, and SW43$i$ and/or resistance values of the resistors R41$i$, R42$i$, and R43$i$ can be designed based on the attenuation corresponding to the attenuation unit ATUi; the resistance values of the on-resistances of the switches SW41n, SW42n, and SW43n and/or resistance values of the resistors R41n, R42n, and R43n can be designed based on the attenuation corresponding to the attenuation unit ATUn, and so on. That is to say, the switches SW411 to SW43n can not only be used for switching the corresponding attenuation unit ATUi to ATUn, but also for providing the corresponding attenuation based on actual design. In another embodiment, an overall resistance value of the switch SW411 and the resistor R411 and an overall resistance value of the switch SW421 and the resistor R421 can be designed to be the same; an overall resistance value of the switch SW41i and the resistor R41i and an overall resistance value of the switch SW42i and the resistor R42i can be designed to be the same; an overall resistance value of the switch SW41n and the resistor R41n and an overall resistance value of the switch SW42n and the resistor R42n can be designed to be the same, and so on. In addition, taking the attenuation units ATU1, ATUi, and ATUn being respectively used for providing the attenuations of 5 dB, 10 dB, and 20 dB, as an example, an overall resistance value of the switch SW431 and the resistor R431 can be less than an overall resistance value of the switch SW43i and the resistor R43i, and the overall resistance value of the switch SW43i and the resistor R43i can be less than an overall resistance value of the switch SW43n and the resistor R43n. In the present embodiment, through a design of a channel width-to-length ratio of the switches SW411 to SW43n, the switches SW411 to SW43n each can have the appropriate resistance value of the on-resistance. In this way, when one of the attenuation units ATU1 to ATUn is enabled, the corresponding attenuation can be provided.

Figure 6:
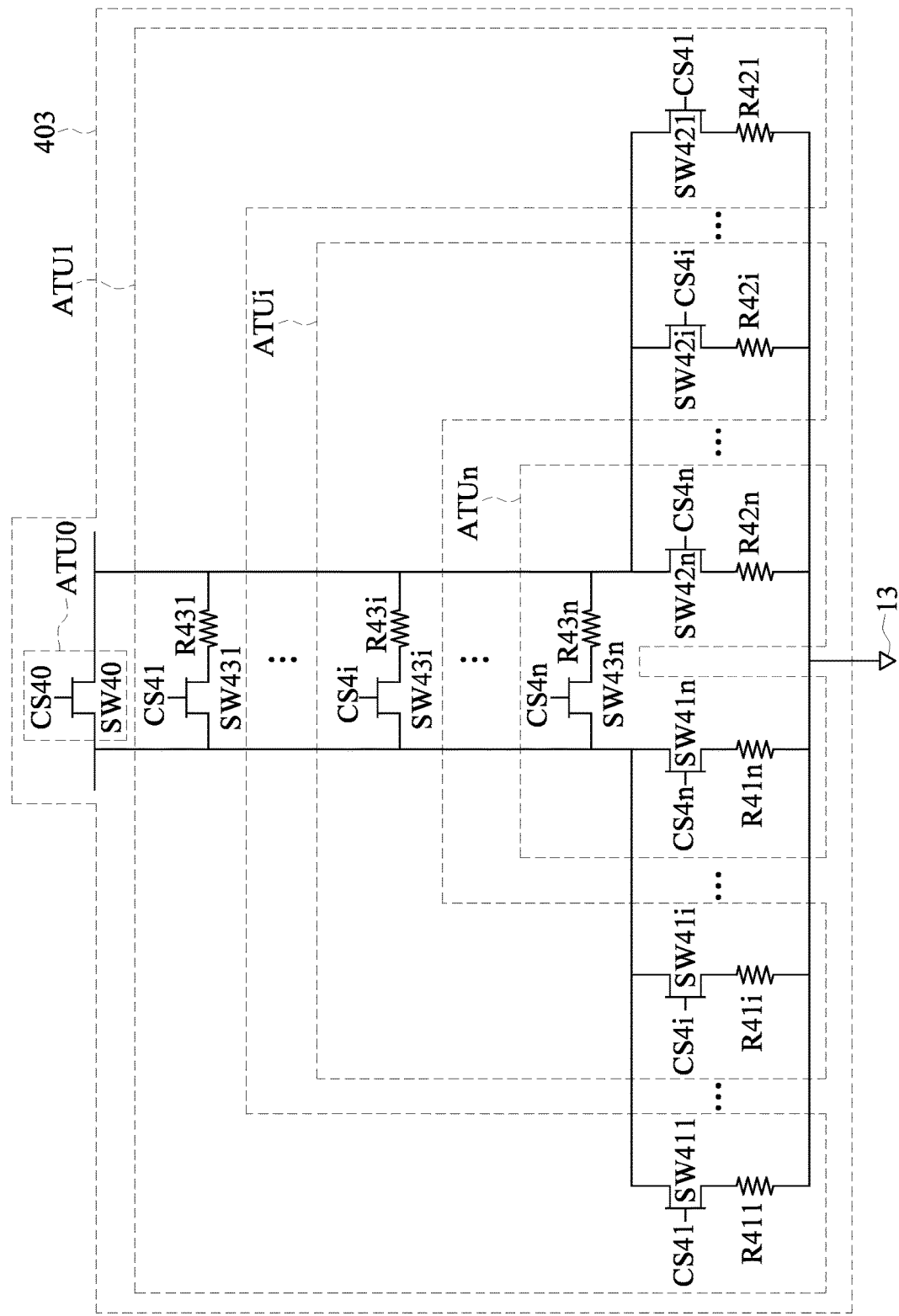
FIG. 6 is another schematic circuit layout diagram of an attenuation circuit of the amplifier circuit having the adjustable gain according to the first embodiment or the third embodiment of the present disclosure.

Referring to FIG. 6, FIG. 6 is still another schematic circuit layout diagram of the attenuation circuit 40 of the amplifier circuit 1 or 3 having the adjustable gain according to the first embodiment or the third embodiment of the present disclosure. An attenuation circuit 403 of FIG. 6 can correspond to the attenuation circuit 40 of FIG. 1 or FIG. 3.

The main difference between the attenuation circuit 402 shown in FIG. 5 and the attenuation circuit 403 of FIG. 6 is that, the resistors R411 to R43n are arranged in different positions. As shown in FIG. 6, the first terminal of each of the resistors R411 to R41n is coupled to the second terminal of the switches SW411 to SW41n that respectively correspond to the resistors R411 to R41n, and the second terminal of each of the resistors R411 to R41n is coupled to the reference potential terminal 13. The first terminal of each of the resistors R421 to R42n is coupled to the second terminal of the switches SW421 to SW42n that respectively correspond to the resistors R421 to R42n, and the second terminal of each of the resistors R421 to R42n is coupled to the reference potential terminal 13. The first terminal of each of the resistors R431 to R43n is coupled to the second terminal of the switches SW431 to SW43n that respectively correspond to the resistors R431 to R43n, and the second terminal of each of the resistors R431 to R43n is coupled to the output terminal of the attenuation circuit 403. A principle and operation of the attenuation circuit 403 are similar to those of the attenuation circuit 402, and will not be reiterated herein. It should be noted that, when one of the plurality of attenuation units ATU1 to ATUn is disabled, the switch SW431 to SW43n that corresponds to the one of the plurality of attenuation units ATU1 to ATUn is turned off, such that a noise generated by the resistor R431 to R43n that corresponds to the one of the plurality of attenuation units ATU1 to ATUn is less likely to affect a signal transmission path, thereby reducing a noise figure of the amplifier circuit.

Figure 7:
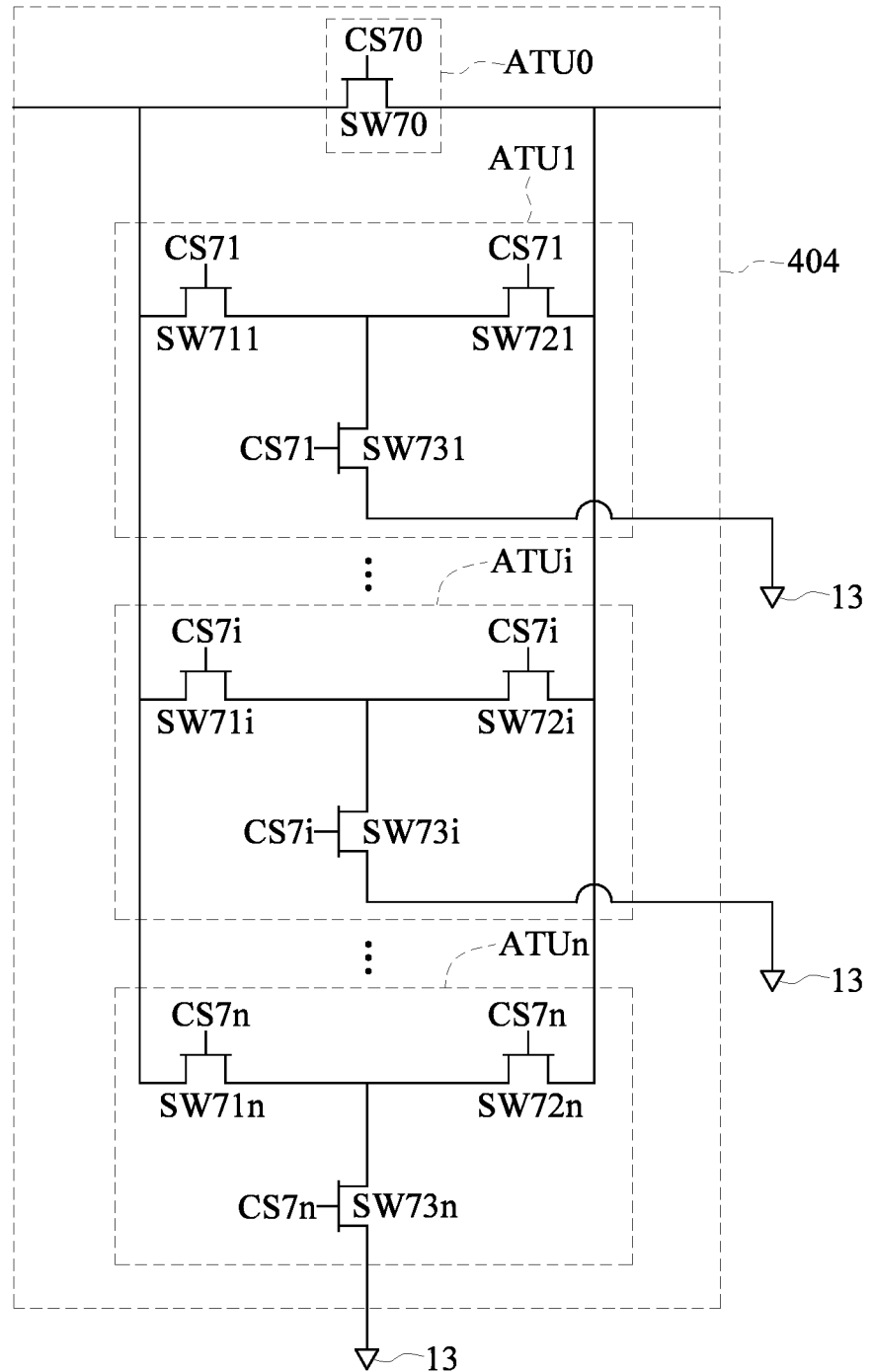
FIG. 7 is still another schematic circuit layout diagram of an attenuation circuit of the amplifier circuit having the adjustable gain according to the first embodiment or the third embodiment of the present disclosure.

Referring to FIG. 7, FIG. 7 is yet another schematic circuit layout diagram of the attenuation circuit 40 of the amplifier circuit 1 or 3 having the adjustable gain according to the first embodiment or the third embodiment of the present disclosure. An attenuation circuit 404 of FIG. 7 can correspond to the attenuation circuit 40 of FIG. 1 or FIG. 3.

The main difference between the attenuation circuit 401 shown in FIG. 4 and the attenuation circuit 404 of FIG. 7 is that, one of the plurality of attenuation units (e.g., the attenuation unit ATU0) can include a switch SW70, and the rest of the plurality of attenuation units (e.g., the attenuation units ATU1 to ATUn) can each include a T-type attenuator. As shown in FIG. 7, a control terminal of the switch SW70 is used for receiving a control signal CS70, and the control signal CS70 can be used for turning on or turning off the switch SW70, thereby enabling or disabling the attenuation unit ATU0 (e.g., turning on the switch SW70 can enable the attenuation unit ATU0, thereby providing the attenuation of 0 dB); the T-type attenuator of the attenuation unit ATU1 can include switches SW711, SW721, and SW731, and a control terminal of each of the switches SW711, SW721, and SW731 is used for receiving a control signal CS71; the control signal CS71 can be used for turning on or turning off the switches SW711, SW721, and SW731, thereby enabling or disabling the attenuation unit ATU1 (e.g., turning on the switches SW711, SW721, and SW731 can enable the attenuation unit ATU1, thereby providing the attenuation of 5 dB); the T-type attenuator of the attenuation unit ATUi can include switches SW71i, SW72i, and SW73i, and a control terminal of each of the switches SW71i, SW72i, and SW73i is used for receiving a control signal CS7i; the control signal CS7i can be used for turning on or turning off the switches SW71i, SW72i, and SW73i, thereby enabling or disabling the attenuation unit ATUi; the T-type attenuator of the attenuation unit ATUn can include switches SW71n, SW72n, and SW73n, and a control terminal of each of the switches SW71n, SW72n, and SW73n is used for receiving a control signal CS7n; the control signal CS7n can be used for turning on or turning off the switches SW71n, SW72n, and SW73n, thereby enabling or disabling the attenuation unit ATUn, and so on, where i and n are positive numbers. The control signals CS70 to CS7n can be provided by an internal circuit of the attenuation circuit 404 (not shown in the figures) or an external circuit other than the attenuated circuit 404 (not shown in the figures). It should be noted that, although a quantity of the attenuation units shown in FIG. 7 is greater than two, in practice, the quantity of the attenuation units may vary depending on a practical application or a design requirement. Therefore, the quantity of the attenuation units shown in FIG. 7 is for illustrative purposes only, and should not be construed as limiting the present disclosure.

In addition, a first terminal of the switch SW70 is coupled to the input terminal of the attenuation circuit 404, and a second terminal of the switch SW70 is coupled to the output terminal of the attenuation circuit 404. A first terminal of each of the switches SW711 to SW71n is coupled to the input terminal of the attenuation circuit 404. A first terminal of each of the switches SW721 to SW72n is correspondingly coupled to a second terminal of the switches SW711 to SW71n, and a second terminal of each of the switches SW721 to SW72n is coupled to the output terminal of the attenuation circuit 404. A first terminal of each of the switches SW731 to SW73n is correspondingly coupled to a second terminal of the switches SW711 to SW71n and the first terminal of the switches SW721 to SW72n, and a second terminal of each of the switches SW731 to SW73n is coupled to the reference potential terminal 13.

The attenuation corresponding to each of the plurality of attenuation units ATUi to ATUn can be related to a resistance value of each of the plurality of attenuation units ATUi to ATUn. For example, a resistance value of an on-resistance of each of the switches SW711, SW721, and SW731, can be designed based on the attenuation corresponding to the attenuation unit ATU1; a resistance value of an on-resistance of each of the switches SW71i, SW72i, and SW73i, can be designed based on the attenuation corresponding to the attenuation unit ATUi; a resistance value of an on-resistance of each of the switches SW71n, SW72n, and SW73n, can be designed based on the attenuation corresponding to the attenuation unit ATUn, and so on. That is to say, the switches SW711 to SW73n can not only be used for switching the corresponding attenuation unit ATUi to ATUn, but also for providing the corresponding attenuation based on actual design. In another embodiment, the resistance values of the on-resistances of the switches SW711 and SW721 can be designed to be the same; the resistance values of the on-resistances of the switches SW71i and SW72i can be designed to be the same; the resistance values of the on-resistances of the switches SW71n and SW72n can be designed to be the same, and so on. In addition, taking the attenuation units ATU1, ATUi, and ATUn being respectively used for providing the attenuations of 5 dB, 10 dB, and 20 dB as an example, the resistance value of the on-resistance of the switch SW731 can be greater than the resistance value of the on-resistance of the switch SW73i, and the resistance value of the on-resistance of the switch SW73i can be greater than the resistance value of the on-resistance of the switch SW73n. In the present embodiment, through a design of a channel width-to-length ratio of the switches SW711 to SW73n, the switches SW711 to SW73n can each have the appropriate resistance value of the on-resistance. In this way, when one of the attenuation units ATU1 to ATUn is enabled, the corresponding attenuation can be provided.

It should be noted that, the attenuation circuit 404 includes the plurality of T-type attenuators and can be accordingly considered as having a roughly symmetrical circuit architecture. Under such circuit architecture, a difference between an impedance value of the input terminal of the attenuation circuit 404 and an impedance value of the output terminal of the attenuation circuit 404 can be within a predetermined range regardless of which one of the attenuation units ATU0 to ATUn is enabled. The predetermined range can be ±10%. In another embodiment, the impedance value of the input terminal of the attenuation circuit 404 and the impedance value of the output terminal of the attenuation circuit 404 can be substantially equal, which can refer to a conjugate match is achieved between the impedance value of the input terminal of the attenuation circuit 404 and the impedance value of the output terminal of the attenuation circuit 404. That is to say, the impedance value of the output terminal of the attenuation circuit 404 is a conjugate complex number of the impedance value of the input terminal of the attenuation circuit 404. Further, the impedance value of the input terminal of the attenuation circuit 404 can be an equivalent impedance value viewed inward from the input terminal of the attenuation circuit 404, and the impedance value of the output terminal of the attenuation circuit 404 can be an equivalent impedance value viewed outward from the output terminal of the attenuation circuit 404. In addition, in conjunction with FIG. 4 and FIG. 7, a difference between an equivalent impedance value viewed inward from the output terminal of the amplifier 201 and an equivalent impedance value viewed outward from the output terminal 12 of the amplifier circuit 1 can also be within the predetermined range.

Figure 8:
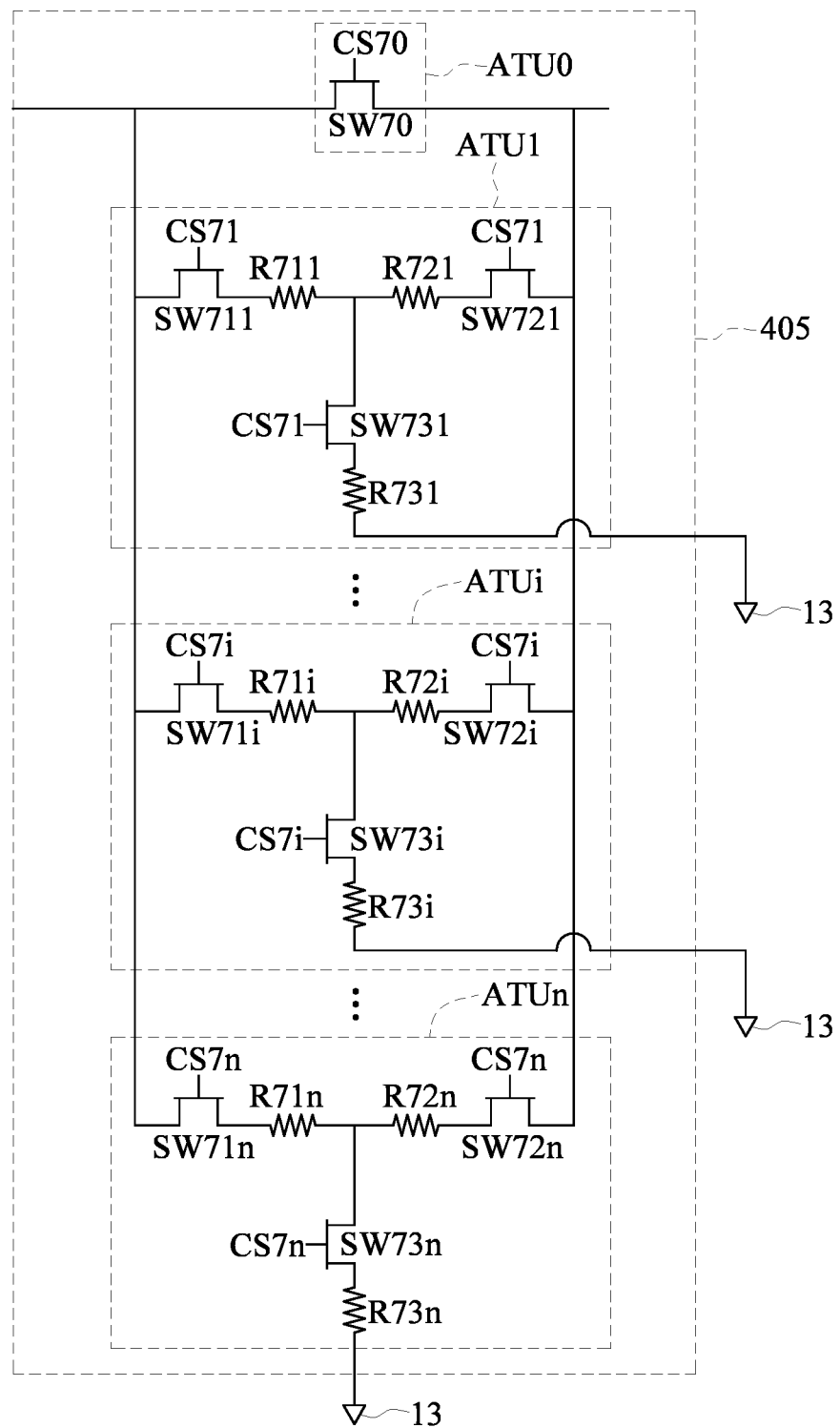
FIG. 8 is yet another schematic circuit layout diagram of an attenuation circuit of the amplifier circuit having the adjustable gain according to the first embodiment or the third embodiment of the present disclosure.

Referring to FIG. 8, FIG. 8 is yet another schematic circuit layout diagram of the attenuation circuit 40 of the amplifier circuit 1 or 3 having the adjustable gain according to the first embodiment or the third embodiment of the present disclosure. An attenuation circuit 405 of FIG. 8 can correspond to the attenuation circuit 40 of FIG. 1 or FIG. 3.

The main difference between the attenuation circuit 405 shown in FIG. 8 and the attenuation circuit 404 of FIG. 7 is that, the T-type attenuator of the attenuation unit ATU1 can further include resistors R711, R721, and R731; the T-type attenuator of the attenuation unit ATUi can further include resistors R71i, R72i, and R73i; the T-type attenuator of the attenuation unit ATUn can further include resistors R71n, R72n, and R73n, and so on.

As shown in FIG. 8, a first terminal of each of the resistors R711 to R71n is coupled to the second terminal of the switches SW711 to SW71n that respectively correspond the resistors R711 to R71n, and a second terminal of each of the resistors R711 to R71n is coupled to the first terminal of the switches SW731 to SW73n that respectively correspond to the resistors R711 to R71n. A first terminal of each of the resistors R721 to R72n is coupled to the first terminal of the switches SW731 to SW73n that respectively correspond to the resistors R721 to R72n, and a second terminal of each of the resistors R721 to R72n is coupled to the first terminal of the switches SW721 to SW72n that respectively correspond to the resistors R721 to R72n. A first terminal of each of the resistors R731 to R73n is coupled to the second terminal of the switches SW731 to SW73n that respectively correspond to the resistors R731 to R73n, and a second terminal of each of the resistors R731 to R73n is coupled to the reference potential terminal 13.

The resistor R711 to R73n can be used for increasing a flexibility of the design corresponding to the resistance value of the attenuation units ATUi to ATUn. Further, the resistance values of the on-resistances of the switches SW711, SW721, and SW731 and/or resistance values of the resistors R711, R721, and R731 can be designed based on the attenuation corresponding to the attenuation unit ATU1; the resistance values of the on-resistances of the switches SW71i, SW72i, and SW73i and/or resistance values of the resistors R71i, R72i, and R73i can be designed based on the attenuation corresponding to the attenuation unit ATUi; the resistance values of the on-resistances of the switches SW71n, SW72n, and SW73n and/or resistance values of the resistors R71n, R72n, and R73n can be designed based on the attenuation corresponding to the attenuation unit ATUn, and so on. That is to say, the switches SW711 to SW73n can not only be used for switching the corresponding attenuation unit ATUi to ATUn, but also for providing the corresponding attenuation based on actual design. In another embodiment, an overall resistance value of the switch SW711 and the resistor R711 and an overall resistance value of the switch SW721 and the resistor R721 can be designed to be the same; an overall resistance value of the switch SW71i and the resistor R71i and an overall resistance value of the switch SW72i and the resistor R72i can be designed to be the same; an overall resistance value of the switch SW71n and the resistor R71n and an overall resistance value of the switch SW72n and the resistor R72n can be designed to be the same, and so on. In addition, taking the attenuation units ATU1, ATUi, and ATUn being respectively used for providing the attenuations of 5 dB, 10 dB, and 20 dB, as an example, an overall resistance value of the switch SW731 and the resistor R731 can be greater than an overall resistance value of the switch SW73$i$ and the resistor R73$i$, and the overall resistance value of the switch SW73$i$ and the resistor R73$i$ can be greater than an overall resistance value of the switch SW73$n$ and the resistor R73$n$. In the present embodiment, through a design of a channel width-to-length ratio of the switches SW711 to SW73$n$, the switches SW711 to SW73$n$ each can have the appropriate resistance value of the on-resistance. In this way, when one of the attenuation units ATUi to ATUn is enabled, the corresponding attenuation can be provided. It should be noted that, when one of the plurality of attenuation units ATUi to ATUn is disabled, the switch SW711 to SW71$n$ and SW721 to SW72$n$ that corresponds to the one of the plurality of attenuation units ATU1 to ATUn is turned off, such that a noise generated by the resistor R711 to R71$n$ and R721 to R72$n$ that corresponds to the one of the plurality of attenuation units ATUi to ATUn is less likely to affect a signal transmission path, thereby reducing a noise figure of the amplifier circuit.

Figure 9:
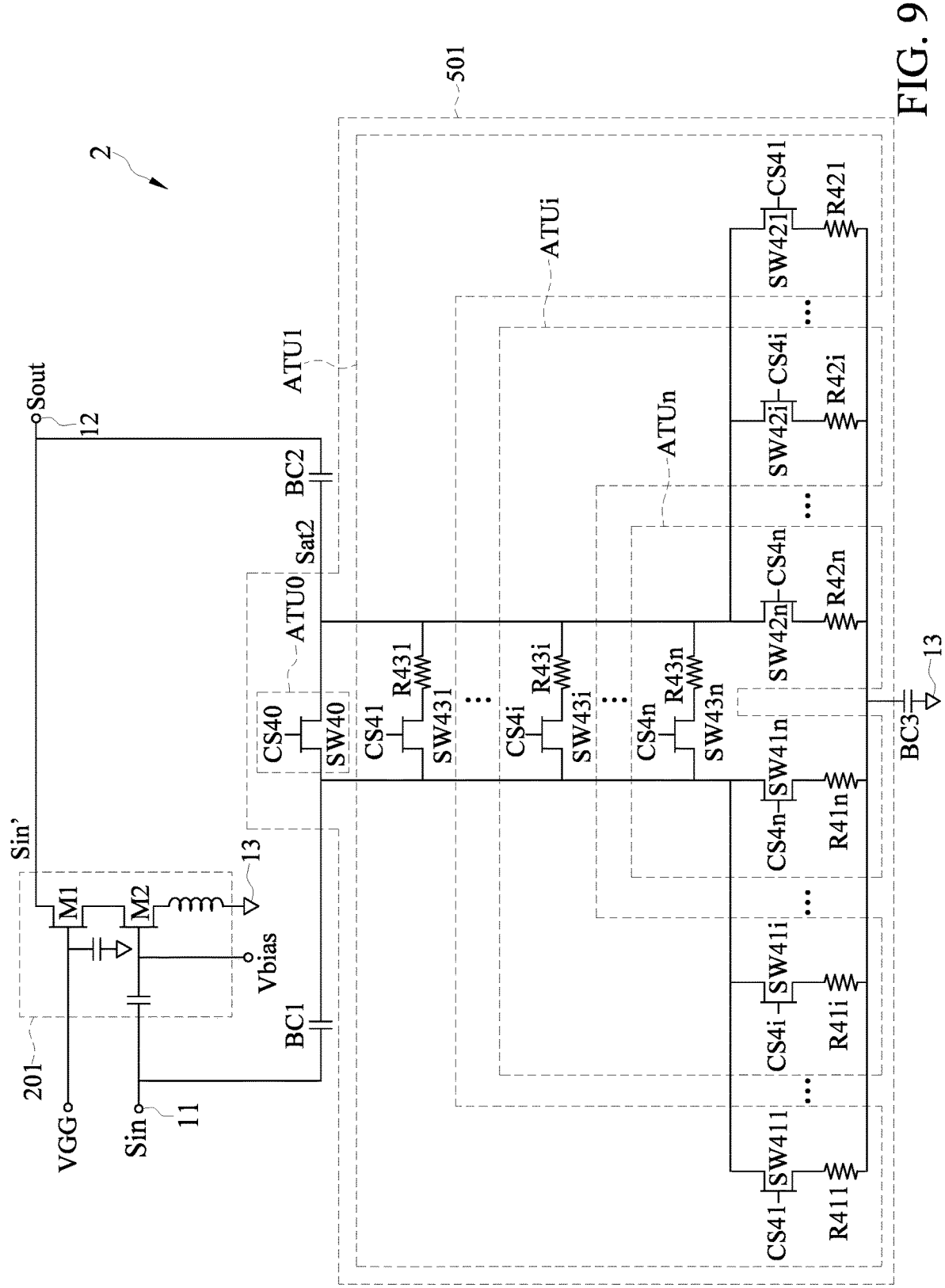
FIG. 9 is a schematic circuit layout diagram of the amplifier circuit having the adjustable gain according to the second embodiment of the present disclosure.

Referring to FIG. 9, FIG. 9 is a schematic circuit layout diagram of the amplifier circuit 2 having the adjustable gain according to the second embodiment of the present disclosure. An amplifier 201 and an attenuation circuit 501 of FIG. 9 respectively correspond to the amplifier 20 and the attenuation circuit 50 of FIG. 2. The amplifier 201 is described in the above embodiment, and is not reiterated herein.

In the present embodiment, the attenuation circuit 501 can include the same components as the attenuation circuit 403 shown in FIG. 6, but the present disclosure is not limited thereto. In another embodiment, the attenuation circuit 501 can include the same components as one of the attenuation circuits 401, 402, 404, and 405 respectively shown in FIG. 4, FIG. 5, FIG. 7, and FIG. 8.

Similarly, the attenuation circuit 50 shown in FIG. 3 can also include the same components as one of the attenuation circuits 401 to 405 respectively shown in FIG. 4 to FIG. 8.

Figure 10:
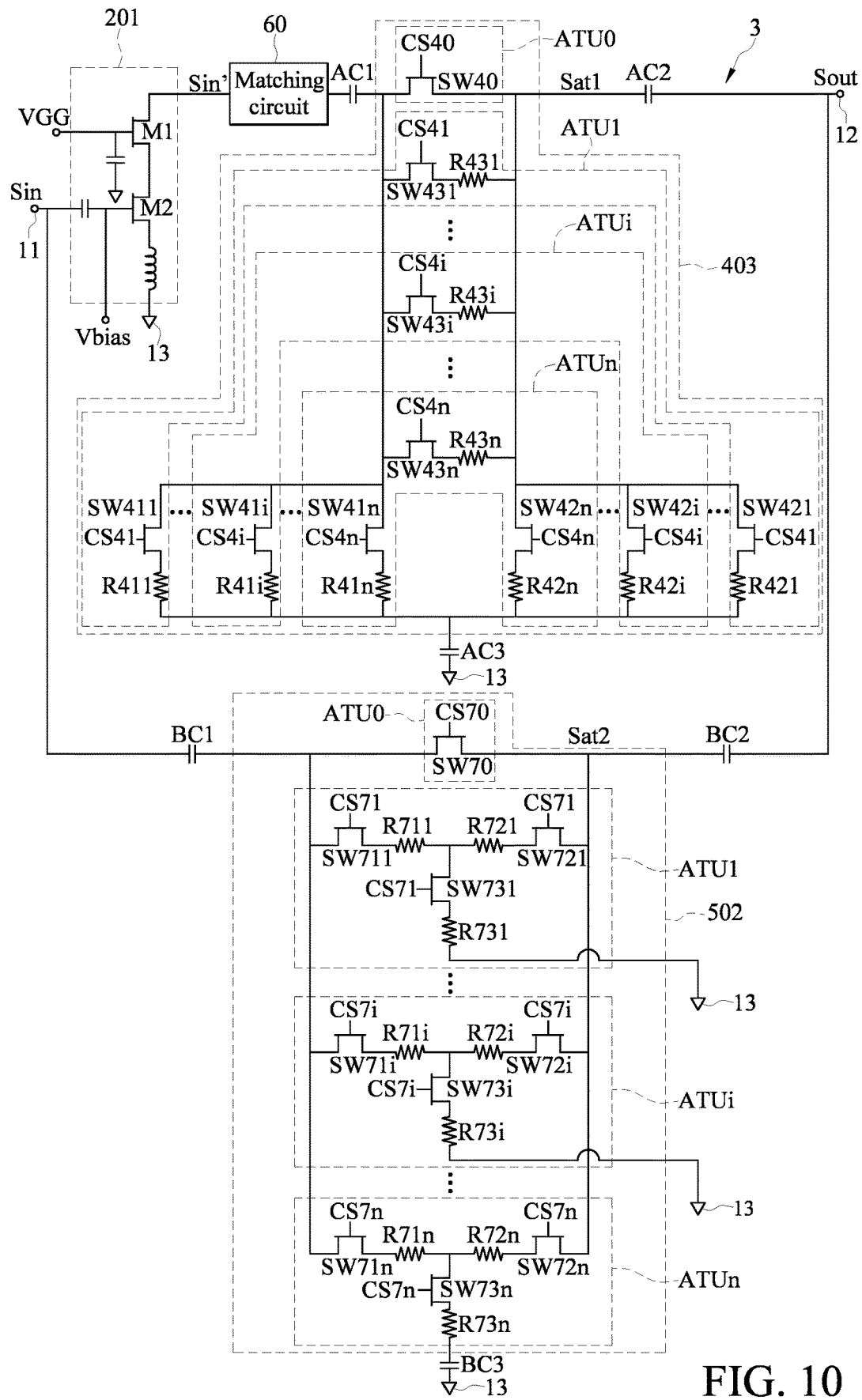
FIG. 10 is a schematic circuit layout diagram of the amplifier circuit having the adjustable gain according to the third embodiment of the present disclosure.

Referring to FIG. 10, FIG. 10 is a schematic circuit layout diagram of the amplifier circuit 3 having the adjustable gain according to the third embodiment of the present disclosure. An amplifier 201, attenuation circuits 403 and 502 of FIG. 10 respectively correspond to the amplifier 20, and the attenuation circuits 40 and 50 of FIG. 3. The amplifier 201 and the attenuation circuit 403 are described in the above embodiment, and are not reiterated herein.

In the present embodiment, the attenuation circuit 502 can include the same components as the attenuation circuit 405 shown in FIG. 8, but the present disclosure is not limited thereto. In another embodiment, the attenuation circuit 502 can include the same components as one of the attenuation circuits 401 to 404 respectively shown in FIG. 4 to FIG. 7. In addition, in another embodiment, the attenuation circuit 403 can be replaced with one of the attenuation circuits 401, 402, 404 and 405 respectively shown in FIG. 4, FIG. 5, FIG. 7, and FIG. 8.

As shown in FIG. 10, the amplifier circuit 3 can further include the matching circuit 60 and capacitors BC1, BC2, and BC3. The matching circuit 60 is described in the above embodiment, and is not reiterated herein. The capacitor BC1 is coupled between the input terminal 11 and the attenuation circuit 502, the capacitor BC2 is coupled between the attenuation circuit 502 and the output terminal 12, and the capacitor BC3 is coupled between the attenuation circuit 502 and the reference potential terminal 13. The capacitor BC1 can be used for blocking a direct current bias from the input terminal 11, and the capacitors BC2 and BC3 can be used for blocking a direct current bias from the attenuation circuit 502.

In the above embodiment, each of the switches SW40 to SW73$n$ and the transistors M1 and M2 can be a field effect transistor (FET) or other types of transistors. When the switches SW40 to SW73$n$ or the transistors M1 and M2 is the FET, the first terminal of the switches SW40 to SW73$n$ or the transistors M1 and M2 can be one of a drain terminal and a source terminal, the second terminal of the switches SW40 to SW73$n$ or the transistors M1 and M2 can be another one of the drain terminal and the source terminal, and the control terminal of the switches SW40 to SW73$n$ or the transistors M1 and M2 can be a gate terminal.

Beneficial Effects of the Embodiments

In conclusion, in the amplifier circuit having the adjustable gain provided by the present disclosure, the gain value range of the amplifier circuit can be expanded and the gain value of the amplifier circuit can be adjusted through the attenuation circuit. Moreover, since the attenuation circuit can be designed to have the roughly symmetrical circuit architecture, the arrangement of the attenuation circuit does not easily affect the matching of the output impedance of the amplifier of the amplifier circuit.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An amplifier circuit having an adjustable gain, comprising:
   an input terminal used for receiving an input signal;
   an output terminal used for outputting an output signal;
   an amplifier including:
      an input terminal receiving the input signal through the input terminal of the amplifier circuit; and
      an output terminal used for outputting the input signal that is amplified; and
   an attenuation circuit including:
      an input terminal; and
      an output terminal;
   wherein:
      the input terminal of the attenuation circuit is coupled to the output terminal of the amplifier, and the output terminal of the attenuation circuit is coupled to the output terminal of the amplifier circuit, so as to provide a plurality of attenuations to the input signal that is amplified, and generate a first attenuation signal; and
      a gain value of the amplifier circuit is related to a degree of attenuation of the input signal that is amplified, and the gain value is 0 dB or more.

2. The amplifier circuit according to claim 1, wherein the attenuation circuit includes a plurality of attenuation units, and each of the plurality of attenuation units is used for providing one of the plurality of attenuations.

3. The amplifier circuit according to claim 2, wherein one of the plurality of attenuation units is used for providing a first attenuation of the plurality of attenuations, another one of the plurality of attenuation units is used for providing a second attenuation of the plurality of attenuations, and the second attenuation is greater than the first attenuation.

4. An amplifier circuit having an adjustable gain, comprising:
   an input terminal used for receiving an input signal;
   an output terminal used for outputting an output signal;
   an amplifier including:
      an input terminal receiving the input signal through the input terminal of the amplifier circuit; and
      an output terminal used for outputting the input signal that is amplified; and
   an attenuation circuit including:
      an input terminal; and
      an output terminal;
   wherein:
      the input terminal of the attenuation circuit is coupled to the output terminal of the amplifier, and the output terminal of the attenuation circuit is coupled to the output terminal of the amplifier circuit, so as to provide a plurality of attenuations to the input signal that is amplified, and generate a first attenuation signal; or wherein the input terminal of the attenuation circuit is coupled to the input terminal of the amplifier circuit, and the output terminal of the attenuation circuit is coupled to the output terminal of the amplifier circuit, so as to provide the plurality of attenuations to the input signal, and generate a second attenuation signal;
      the attenuation circuit includes a plurality of attenuation units, and each of the plurality of attenuation units is used for providing one of the plurality of attenuations; and
      one of the plurality of attenuation units is used for providing the attenuation of 0 dB out of the plurality of attenuations.

5. The amplifier circuit according to claim 2, wherein, when one of the plurality of attenuation units is enabled, the rest of the plurality of attenuation units are disabled.

6. The amplifier circuit according to claim 2, wherein one of the plurality of attenuation units includes a first switch, a first terminal of the first switch is coupled to the input terminal of the attenuation circuit, a second terminal of the first switch is coupled to the output terminal of the attenuation circuit, and a control terminal of the first switch is used for receiving a first control signal.

7. The amplifier circuit according to claim 6, wherein the rest of the plurality of attenuation units each include a x-type attenuator or a T-type attenuator.

8. The amplifier circuit according to claim 6, wherein another one of the plurality of attenuation units includes a first x-type attenuator used for providing a first attenuation of the plurality of attenuations, and the first x-type attenuator includes:
   a second switch, wherein a first terminal of the second switch is coupled to the input terminal of the attenuation circuit, a second terminal of the second switch is coupled to a reference potential terminal, and a control terminal of the second switch is used for receiving a second control signal;
   a third switch, wherein a first terminal of the third switch is coupled to the output terminal of the attenuation circuit, a second terminal of the third switch is coupled to the reference potential terminal, and a control terminal of the third switch is used for receiving the second control signal; and
   a fourth switch, wherein a first terminal of the fourth switch is coupled to the input terminal of the attenuation circuit, a second terminal of the fourth switch is coupled to the output terminal of the attenuation circuit, and a control terminal of the fourth switch is used for receiving the second control signal.

9. The amplifier circuit according to claim 8, wherein yet another one of the plurality of attenuation units includes a second π-type attenuator used for providing a second attenuation of the plurality of attenuations, and the second π-type attenuator includes:
   a fifth switch, wherein a first terminal of the fifth switch is coupled to the input terminal of the attenuation circuit, a second terminal of the fifth switch is coupled to the reference potential terminal, and a control terminal of the fifth switch is used for receiving a third control signal;
   a sixth switch, wherein a first terminal of the sixth switch is coupled to the output terminal of the attenuation circuit, a second terminal of the sixth switch is coupled to the reference potential terminal, and a control terminal of the sixth switch is used for receiving the third control signal; and
   a seventh switch, wherein a first terminal of the seventh switch is coupled to the input terminal of the attenuation circuit, a second terminal of the seventh switch is coupled to the output terminal of the attenuation circuit, and a control terminal of the seventh switch is used for receiving the third control signal.

10. The amplifier circuit according to claim 9, wherein an on-resistance of the fourth switch has a first resistance value, and an on-resistance of the seventh switch has a second resistance value; wherein the first attenuation is less than the second attenuation, and the first resistance value is less than the second resistance value.

11. An amplifier circuit having an adjustable gain, comprising:
    an input terminal used for receiving an input signal;
    an output terminal used for outputting an output signal;
    an amplifier including:
       an input terminal receiving the input signal through the input terminal of the amplifier circuit; and
       an output terminal used for outputting the input signal that is amplified; and
    an attenuation circuit including:
       an input terminal; and
       an output terminal;
    wherein:
       the input terminal of the attenuation circuit is coupled to the output terminal of the amplifier, and the output terminal of the attenuation circuit is coupled to the output terminal of the amplifier circuit, so as to provide a plurality of attenuations to the input signal that is amplified, and generate a first attenuation signal; or wherein the input terminal of the attenuation circuit is coupled to the input terminal of the amplifier circuit, and the output terminal of the attenuation circuit is coupled to the output terminal of the amplifier circuit, so as to provide the plurality of attenuations to the input signal, and generate a second attenuation signal;

the attenuation circuit includes a plurality of attenuation units, and each of the plurality of attenuation units is used for providing one of the plurality of attenuations;

one of the plurality of attenuation units includes a first switch, a first terminal of the first switch is coupled to the input terminal of the attenuation circuit, a second terminal of the first switch is coupled to the output terminal of the attenuation circuit, and a control terminal of the first switch is used for receiving a first control signal;

another one of the plurality of attenuation units includes a first x-type attenuator used for providing a first attenuation of the plurality of attenuations, and the first x-type attenuator includes:
- a second switch, wherein a first terminal of the second switch is coupled to the input terminal of the attenuation circuit, a second terminal of the second switch is coupled to a reference potential terminal, and a control terminal of the second switch is used for receiving a second control signal;
- a third switch, wherein a first terminal of the third switch is coupled to the output terminal of the attenuation circuit, a second terminal of the third switch is coupled to the reference potential terminal, and a control terminal of the third switch is used for receiving the second control signal;
- a fourth switch, wherein a first terminal of the fourth switch is coupled to the input terminal of the attenuation circuit, a second terminal of the fourth switch is coupled to the output terminal of the attenuation circuit, and a control terminal of the fourth switch is used for receiving the second control signal;
- a first resistor, wherein a first terminal of the first resistor is coupled to the input terminal of the attenuation circuit and a second terminal of the first resistor is coupled to the first terminal of the second switch, or the first terminal of the first resistor is coupled to the second terminal of the second switch and the second terminal of the first resistor is coupled to the reference potential terminal;
- a second resistor, wherein a first terminal of the second resistor is coupled to the output terminal of the attenuation circuit and a second terminal of the second resistor is coupled to the first terminal of the third switch, or the first terminal of the second resistor is coupled to the second terminal of the third switch and the second terminal of the second resistor is coupled to the reference potential terminal; and
- a third resistor, wherein a first terminal of the third resistor is coupled to the input terminal of the attenuation circuit and a second terminal of the third resistor is coupled to the first terminal of the fourth switch, or the first terminal of the third resistor is coupled to the second terminal of the fourth switch and the second terminal of the third resistor is coupled to the output terminal of the attenuation circuit.

12. The amplifier circuit according to claim 6, wherein another one of the plurality of attenuation units includes a first T-type attenuator used for providing a first attenuation of the plurality of attenuations, and the first T-type attenuator includes:
- an eighth switch, wherein a first terminal of the eighth switch is coupled to the input terminal of the attenuation circuit, and a control terminal of the eighth switch is used for receiving a fourth control signal;
- a ninth switch, wherein a first terminal of the ninth switch is coupled to a second terminal of the eighth switch, a second terminal of the ninth switch is coupled to the output terminal of the attenuation circuit, and a control terminal of the ninth switch is used for receiving the fourth control signal; and
- a tenth switch, wherein a first terminal of the tenth switch is correspondingly coupled to the second terminal of the eighth switch and the first terminal of the ninth switch, a second terminal of the tenth switch is coupled to a reference potential terminal, and a control terminal of the tenth switch is used for receiving the fourth control signal.

13. The amplifier circuit according to claim 12, wherein yet another one of the plurality of attenuation units includes a second T-type attenuator used for providing a second attenuation of the plurality of attenuations, and the second T-type attenuator includes:
- an eleventh switch, wherein a first terminal of the eleventh switch is coupled to the input terminal of the attenuation circuit, and a control terminal of the eleventh switch is used for receiving a fifth control signal;
- a twelfth switch, wherein a first terminal of the twelfth switch is coupled to a second terminal of the eleventh switch, a second terminal of the twelfth switch is coupled to the output terminal of the attenuation circuit, and a control terminal of the twelfth switch is used for receiving the fifth control signal; and
- a thirteenth switch, wherein a first terminal of the thirteenth switch is correspondingly coupled to the second terminal of the eleventh switch and the first terminal of the twelfth switch, a second terminal of the thirteenth switch is coupled to the reference potential terminal, and a control terminal of the thirteenth switch is used for receiving the fifth control signal.

14. The amplifier circuit according to claim 13, wherein an on-resistance of the tenth switch has a first resistance value, and an on-resistance of the thirteenth switch has a second resistance value; wherein the first attenuation is less than the second attenuation, and the first resistance value is greater than the second resistance value.

15. The amplifier circuit according to claim 12, wherein the first T-type attenuator further includes:
- a fourth resistor, wherein a first terminal of the fourth resistor is coupled to the second terminal of the eighth switch and a second terminal of the fourth resistor is coupled to the first terminal of the tenth switch;
- a fifth resistor, wherein a first terminal of the fifth resistor is coupled to the first terminal of the tenth switch and a second terminal of the fifth resistor is coupled to the first terminal of the ninth switch; and
- a sixth resistor, wherein a first terminal of the sixth resistor is coupled to the second terminal of the tenth switch and a second terminal of the sixth resistor is coupled to the reference potential terminal.

16. The amplifier circuit according to claim 4, wherein the input terminal of the attenuation circuit is coupled to the input terminal of the amplifier circuit, and the output terminal of the attenuation circuit is coupled to the output terminal of the amplifier circuit, the amplifier circuit operates in an amplification mode so as to have a first gain value, and the output signal is generated from the input signal that is amplified.

17. The amplifier circuit according to claim 16, wherein the amplifier circuit operates in a bypass mode so as to have a second gain value, and the output signal is generated from the second attenuation signal.

18. The amplifier circuit according to claim 17, wherein the second gain value is less than the first gain value, and the second gain value is 0 dB or less.

* * * * *